US006548187B2

(12) United States Patent
Nagai et al.

(10) Patent No.: US 6,548,187 B2
(45) Date of Patent: Apr. 15, 2003

(54) SN BASED ALLOY CONTAINING SN—TI COMPOUND, AND PRECURSOR OF NB3SN SUPERCONDUCTING WIRE

(75) Inventors: Takayuki Nagai, Tokyo (JP); Yoshio Kubo, Tokyo (JP); Kunihiko Egawa, Tokyo (JP); Osamu Taguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/983,340

(22) Filed: Oct. 24, 2001

(65) Prior Publication Data

US 2002/0153119 A1 Oct. 24, 2002

(30) Foreign Application Priority Data

Apr. 19, 2001 (JP) ........................................ 2001-121195

(51) Int. Cl.⁷ .................... B21D 39/00; C22C 13/00; B21C 37/00; H01B 12/00
(52) U.S. Cl. .................... 428/614; 428/606; 420/557; 420/901; 505/230
(58) Field of Search ................................ 420/557, 901; 428/614, 577, 606, 930; 505/124, 230, 231, 704, 775

(56) References Cited

U.S. PATENT DOCUMENTS

| 4,767,470 A | * | 8/1988 | Tachikawa et al. ........... 148/98 |
| 4,803,452 A | * | 2/1989 | Saji et al. .................... 335/301 |
| 5,501,746 A | * | 3/1996 | Egawa et al. .................. 148/98 |
| 5,753,862 A | * | 5/1998 | Kubo et al. ............... 174/125.1 |
| 5,926,942 A | * | 7/1999 | Kubo et al. .................... 29/599 |
| 5,998,336 A | * | 12/1999 | Holcomb .................... 505/124 |
| 6,251,529 B1 | | 6/2001 | Kubo |
| 6,324,746 B1 | * | 12/2001 | Bruzek et al. ................. 29/599 |

FOREIGN PATENT DOCUMENTS

| JP | 2073930 | | 3/1990 |
| JP | 06196031 A | * | 7/1994 |
| JP | 06243746 A | * | 9/1994 |
| JP | 09245540 A | * | 9/1997 |

* cited by examiner

Primary Examiner—Tom Dunn
Assistant Examiner—Colleen P. Cooke
(74) Attorney, Agent, or Firm—Leydig, Voit & Mayer, Ltd.

(57) ABSTRACT

A method for manufacturing a Sn-based alloy containing a finely dispersed Sn—Ti compound includes melting Sn by heating to a temperature in a range from 1300 to 1500° C. in vacuum or an inert gas atmosphere, adding 0.1 to 5% by weight of Ti followed by melting by heating, and casting the molten alloy into a copper mold directly or through a pouring cup. The Sn-based alloy obtained by this method contains the Sn—Ti compound having a maximum particle diameter of 30 $\mu$m and a mean particle diameter of 5 to 20 $\mu$m. A precursor of a $Nb_3Sn$ wire is also obtained by an inner diffusion method using this Sn-based alloy. The $Nb_3Sn$ wire manufactured by using the Sn-based alloy of the present invention exhibits excellent superconductive characteristics. The method of the present invention enables the ingot to be free from a shrinkage cavity appearing during prior art manufacturing processes.

5 Claims, 5 Drawing Sheets

SN BASED ALLOY CONTAINING SN—TI COMPOUND, AND PRECURSOR OF NB3SN SUPERCONDUCTING WIRE

This application is based on Application No. 2001-121195, filed in Japan on Apr. 19, 2001, the contents of which are hereby incorporated by reference.

BACKGROUND OF THE INVENTION

1. Field of the Invention

The present invention relates to a Sn based alloy containing a Sn—Ti compound that is used for manufacturing a $Nb_3Sn$ superconducting wire by an internal diffusion method, and a method for manufacturing the same. The present invention also relates to a precursor of the $Nb_3Sn$ superconducting wire using the Sn based alloy.

2. Description of the Related Art

A method using a $Nb_3Sn$ compound prepared by an internal diffusion method has been proposed for manufacturing superconducting wire. In the internal diffusion method, a precursor of the $Nb_3Sn$ superconducting wire called a module is prepared by integrating a metallic Sn rod at the center of a Cu base metal in which a number of metallic Nb rods are integrated so that they do not make direct contact with each other. The module is heated at about 650° C. and drawn so that Sn reacts with metallic Nb by heat diffusion of the Sn to finally obtain the $Nb_3Sn$ wire useful as a superconducting wire material. For improving the superconductive characteristics of the $Nb_3Sn$ superconducting wire, prepared by the internal diffusion method, in a high magnetic field, a Sn based alloy containing a Sn—Ti compound is prepared by adding Ti into the Sn base metal. It is known in the art that this Sn based alloy has better superconducting properties than $Nb_3Sn$ wire using metallic Sn. However, the Sn based alloy containing the Sn—Ti compound as used herein involves the problem of generating defects due to the mingling of non-molten Ti and Ti oxide into the Sn based alloy during the conventional melt-casting process, because the difference between the melting points of Sn (232° C.) and Ti (1670° C.) is substantially large for manufacturing the Sn base containing Ti, and Ti is liable to be oxidized during the process.

A proposed method for manufacturing a defect-free Sn based alloy containing the Sn—Ti compound comprises, for example, melting Sn by heating at 600 to 1750° C. under an inert gas atmosphere, adding 0.3 to 6.5% by weight of Ti relative to the content of Sn, and casting the mixture into a mold made of cast iron or stainless steel at 500 to 1750° C. (Japanese Patent Publication No. 6-76625).

However, since the Sn—Ti compound is not finely dispersed in the Sn based alloy which was melted under an inert gas atmosphere and cast by using the cast iron or stainless steel mold, improved superconductive characteristics cannot be expected. In addition, since the Sn based alloy containing the Sn—Ti compound produces so large shrinkage cavity, manufacturing yield of the Sn based alloy containing the Sn—Ti compound becomes poor. Therefore, some improvements have been desired in the method for manufacturing the Sn based alloy containing the Sn—Ti compound.

SUMMARY OF THE INVENTION

Accordingly, it is an object of the present invention to provide a method to solve the above problems in the conventional manufacturing methods. A further object of the present invention is to provide a Sn based alloy containing a Sn—Ti compound in which granules of the Sn—Ti compound having a fine particle diameter are uniformly dispersed where permitting the cast ingot to be free from forming the shrinkage cavity, as well as a method for manufacturing the Sn based alloy containing the Sn—Ti compound uniformly dispersed therein.

The present invention provides a Sn based alloy containing a Sn—Ti compound prepared by adding 0.1 to 5% by weight of Ti relative to the content of Sn, wherein the particles of the Sn—Ti compound have a maximum diameter of 30 μm or less and a mean diameter of within a range of 5 to 20 μm.

The present invention also provides a method for manufacturing a Sn based alloy containing a Sn—Ti compound finely dispersed therein, comprising the steps of melting Sn by heating at 1300 to 1500° C. in vacuum or under an inert gas atmosphere, adding 0.1 to 5% by weight of Ti relative to the content of Sn followed by melting the mixture by heating at 1300 to 1500° C., and casting the molten liquid into a mold made of copper.

The present invention further provides a method for manufacturing a Sn based alloy containing a Sn—Ti compound finely dispersed therein, comprising the steps of melting Sn by heating at 1300 to 1500° C. in vacuum or under an inert gas atmosphere, adding 0.1 to 5% by weight of Ti relative to the content of Sn followed by melting the mixture by heating at 1300 to 1500° C., and casting the molten liquid into a mold made of copper through a carbon pouring cup mounted on the copper mold.

The present invention further provides a precursor of a $Nb_3Sn$ superconducting wire having a structure in which a number of the Nb metal materials and Sn based alloys containing the finely dispersed Sn—Ti compound are integrated in a copper based metal so that they do not make direct contact with each other.

DETAILED DESCRIPTION OF THE INVENTION

The Sn based alloy containing the Sn—Ti compound finely dispersed therein is manufactured by adding 0.1 to 5% by weight, preferably 0.5 to 3% by weight, of Ti relative to the content of Sn into the Sn base metal, followed by forming fine particles of the Sn—Ti compound in the Sn base metal. The particles of the Sn—Ti compound finely dispersed in the Sn based alloy have a maximum diameter of 30 μm and mean diameter of within a range of 5 to 20 μm, more preferably a maximum diameter of 15 μm and mean diameter of within a range of 5 to 10 μm. The Sn—Ti compound contained in the Sn based alloy according to the present invention is an alloy mainly comprising $Ti_6Sn_5$, which contains 70% by weight or more, preferably 90% by weight or more of $Ti_6Sn_5$, and most preferably all the alloy is composed of $Ti_6Sn_5$. However, it may contain $Ti_5Sn_3$ and the like other than $Ti_6Sn_5$.

The Sn based alloy containing the Sn—Ti compound finely dispersed therein according to the present invention may be prepared by the steps comprising melting Sn by heating at 1300 to 1500° C. in vacuum or under an inert gas atmosphere, adding 0.1 to 5%, preferably 0.5 to 3% by weight by weight of Ti relative to the content of Sn into the molten alloy followed by melting by heating at 1300 to 1500° C., and casting the molten liquid into a copper mold, or casting into a copper mold through a carbon pouring cup mounted on the top of the copper mold for casting. The copper mold to be used in the present invention may include a water cooling type copper mold and other molds with various shapes besides simple copper molds, provided that the molds are made of copper.

It is necessary in the method according to the present invention to melt Sn and Ti by heating at 1300 to 1500° C. in vacuum or under an inert gas atmosphere. The molten material should be cast into a mold made of copper.

When molds made of conventional cast iron or stainless steel are used for casting, the Sn—Ti compound does not disperse sufficiently and finely in the Sn based alloy and the Sn based alloy contains only particles of the Sn—Ti compound having a relatively large diameter of 50 μm or more. The Sn—Ti compound also does not finely disperse in the Sn based alloy even by using a copper mold when the heating temperature for melting is less than 1300° C., resulting in the Sn based alloy containing the particles of the Sn—Ti compound having a relatively large diameter of about 50 μm.

The Sn based alloy containing finely dispersed particles of the Sn—Ti compound with a maximum diameter of 30 μm and mean diameter of within the range of 5 to 20 μm may be obtained by the method according to the present invention comprising the steps of melting Sn and Ti by heating at 1300 to 1500° C. in vacuum or under an inert gas atmosphere, and casting the molten metal using a mold made of copper. The heating temperature for melting is more preferably in the range of 1400 to 1450° C., since the Sn based alloy containing the particles of the Sn—Ti compound having a maximum diameter of 15 μm and mean diameter of within the range of 5 to 10 μm can be obtained under the conditions described above. This is because using the copper mold enhances a rapidly cooling effect due to increased heat conductivity of the mold, thereby enabling the Sn—Ti compound in the Sn based alloy to be finely dispersed. While a casting temperature of higher than 1500° C. could exert an effect for finely dispersing the Sn—Ti compound contained in the Sn based alloy, the service life of the mold is shortened by using it at a temperature as high as exceeding 1500° C. Such high temperature is in particular not preferable for the purpose of mass-production.

For measuring the particle size of the finely dispersed Sn—Ti compound contained in the Sn based alloy, the cross section of the Sn based alloy is photographed under an optical microscope after grinding the cross section. The diameter of the granular Sn—Ti compound, or the length along the shorter edge of the needle-like Sn—Ti compound, is measured on the photograph of the microscope with respect to ten particles observed within a picture in the area of 9.5×7.3 cm to determine the maximum value and mean value.

A larger shrinkage cavity is formed during solidification of the ingot due to large shrink ratio by cooling in the Sn based alloy containing the Sn—Ti compound according to the present invention. Therefore, it was a problem that the manufacturing yield of the Sn based alloy containing the Sn—Ti compound was poor. In the method according to the present invention, a molten liquid of Sn and Ti is cast into the mold through a carbon pouring cup. Formation of the shrinkage cavity can be prevented by employing such method because the molten liquid in the carbon pouring cup serves as a feed head by filling the space formed by shrinkage of the ingot, thereby improving manufacturing yield of the product.

A precursor of the $Nb_3Sn$ superconducting wire can be manufactured using the Sn based alloy containing the Sn—Ti compound finely dispersed therein according to the present invention. The precursor of the $Nb_3Sn$ superconducting wire has a structure in which a number of rods of the Nb metal material as well as the rods of the Sn based alloy containing the Sn—Ti compound are arranged in a Cu base metal so that these rods do not come into direct contact with each other.

The precursor of the $Nb_3Sn$ superconducting wire actually has a structure in which the rods of the Sn based alloy containing the Sn—Ti compound are integrated at the center of the rod-shaped Cu base metal in which a number of the Nb metal rods are integrated.

The $Nb_3Sn$ superconducting wire can be manufactured by an internal diffusion method using the precursor described above. At first, a plurality of the precursors according to the present invention are assembled, and the assembly is drawn to a desired diameter to form a Nb—Sn composite wire. Then, the Nb—Sn composite wire is heated at 600 to 800° C. for diffusion of Sn to allow Sn to react with Nb in the composite wire. A compound of tri-niobium tin ($Nb_3Sn$) is finally formed to obtain the $Nb_3Sn$ superconducting wire having excellent superconductivity. The particles of the Sn—Ti compound finely dispersed in the Sn based alloy according to the present invention disappear during the reaction described above. However, while the superconducting wire shows excellent superconductive characteristics when the Sn based alloy containing the particles of the Sn—Ti compound with a maximum diameter of 30 μm and mean diameter of within the range of 5 to 20 μm is used, sufficient superconductive characteristics cannot be obtained when the Sn based alloy containing the particles of the Sn—Ti compound having a diameter larger than the diameter as described above is used.

EXAMPLES

The following examples will demonstrate the embodiments of the present invention.

Example 1

The Sn based alloy containing the Sn—Ti compound was manufactured as follows under an Ar gas atmosphere using a microwave furnace capable of melting and casting in an inert gas atmosphere.

Initially, 50 Kg of Sn was placed in a melting crucible and 1 Kg of 7 to 8 mm square Ti pieces with a thickness of 1 mm was placed in an additive chamber (2.0% by weight of Ti relative to the content of Sn is blended). A mold made of copper with an outer diameter of 220 mm, an inner diameter (1) of 85 mm, an inner diameter (2) of 60 mm, and a height of 510 mm was separately prepared, and a release agent was coated on the inner surface of the mold.

Then, after evacuating the insides of the microwave furnace and additive chamber to about $10^{-3}$ Torr, microwave heating was started after confirming that the $O_2$ concentration in the furnace was reduced to 1 ppm or less. The Sn was at first heated to 1300° C. and after completely melting, the Ti in the additive chamber was added into the molten Sn simultaneously with introducing Ar gas, followed by allowing the molten liquid to be maintained at that temperature for 30 minutes. After introducing Ar gas again while heating the molten liquid at 1430° C., the molten liquid was cast into the copper mold previously prepared as described above.

The quality of the Sn based alloy containing the Sn—Ti compound obtained by the method described above was inspected, confirming that an ingot containing 2.02% by weight of Ti close to the target Ti content of 2.0% by weight was obtained. A microscopic observation of the cross section of the ingot showed that the maximum particle diameter and mean particle diameter of the Sn—Ti compound in the Sn based alloy was 15 μm and 10 μm, respectively, and the finely dispersed Sn—Ti compound in the Sn based alloy comprised almost 100% of $Ti_6Sn_5$, a principal Sn—Ti compound.

Figure 1:
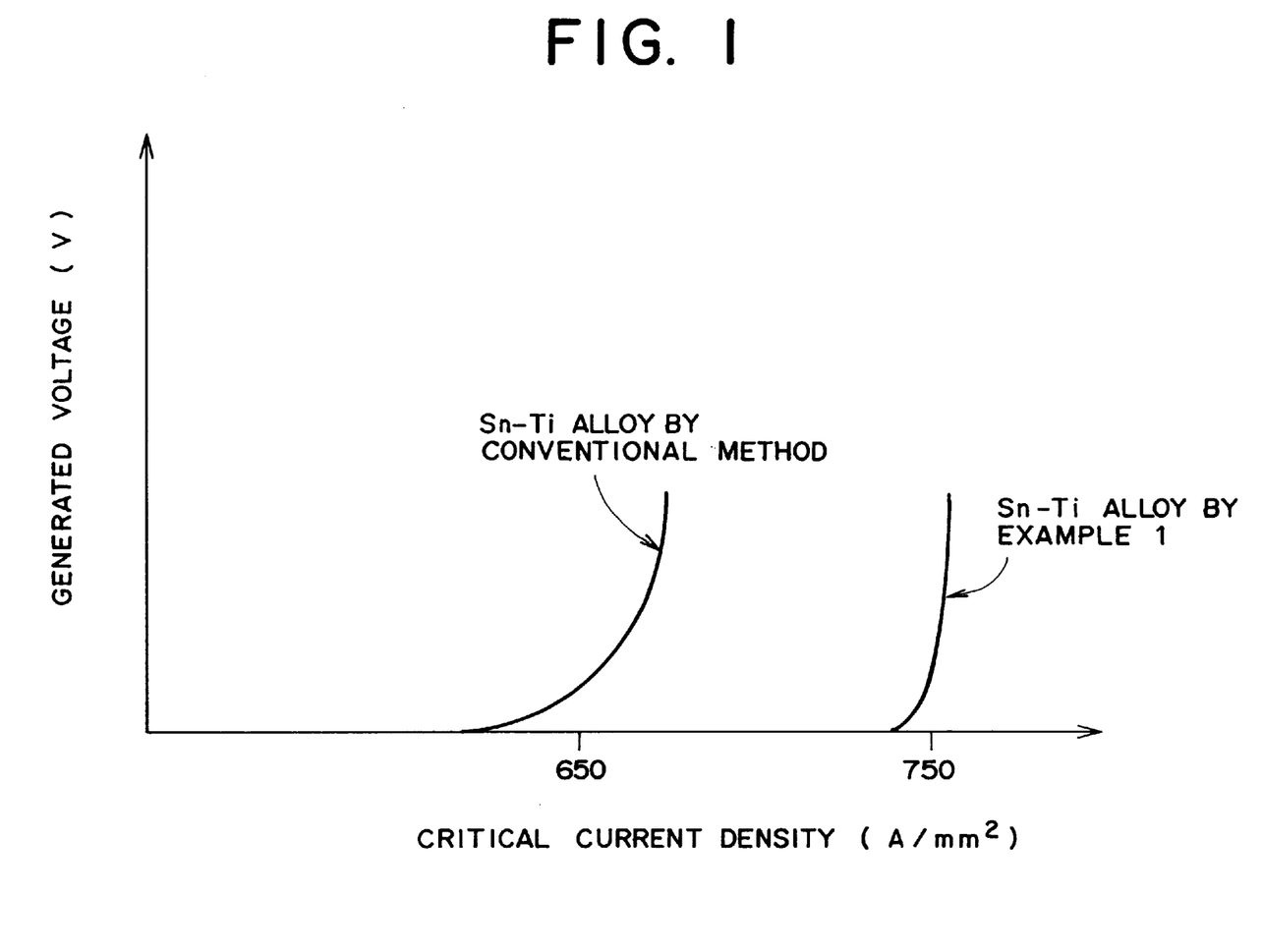
FIG. 1 is a graph showing superconductive current characteristics of the $Nb_3Sn$ wires manufactured by an inner diffusion method when the Sn based alloys containing the Sn—Ti compound prepared in Example 1 according to the present invention and Comparative Example 1 are used in the precursors of the $Nb_3Sn$ wire for applying the inner diffusion method.

The ingot of the Sn based alloy containing the Sn—Ti compound was processed as follows in order to employ it as a starting material for manufacturing a $Nb_3Sn$ superconducting wire by the inner diffusion method. Shrink cavities at the head and bottom of the ingot were eliminated by cutting, and the outer circumference of the ingot was cut to remove fine surface defects of the ingot. Then, the ingot was formed into the prescribed billet shape, and the billet was finished to have a prescribed outer diameter by draw machining using an extruder and a draw bench. The $Nb_3Sn$ superconducting wire was manufactured by an internal diffusion method using the Sn based alloy together with Nb and Cu by applying wire drawing to a final shape, and by applying a heat diffusion treatment. According to the assessment of the superconductive characteristics of the $Nb_3Sn$ superconducting wire using the Sn based alloy of the present invention obtained as described above, a critical current density of 750 A/mm² was obtained as shown in FIG. 1, indicating an improvement of the critical current density by about 15% as compared with the 650 A/mm² of the $Nb_3Sn$ wire using the Sn based alloy manufactured by the conventional method.

A value showing heterogeneity of the superconducting wire along the longitudinal direction is called an "n-value". The n-value of the superconducting wire according to the present invention obtained in Example 1, in which the Sn—Ti compound is finely dispersed, was 30, showing an improvement as compared with the n-value of 20 in the conventional superconducting wire. While the n-value shows heterogeneity of the superconducting wire along the longitudinal direction, it refers to an exponent (n) in more detail when the rising portion of the current (I)-voltage (V) curve of the $Nb_3Sn$ superconducting wire using the Sn based alloy as shown in FIG. 1 is represented by V $I^n$. The exponent (n) is an index applicable for judging the quality of a wire such as unevenness in the diameters of superconducting filaments, homogeneity along the longitudinal direction and contact resistance to a stabilizer in the wire, and the larger n-value shows better characteristics of the wire.

Comparative Example 1

A Sn based alloy containing the Sn—Ti compound was manufactured in an Ar gas atmosphere using a microwave furnace capable of melting and casting by maintaining an inert gas atmosphere.

Figure 4:
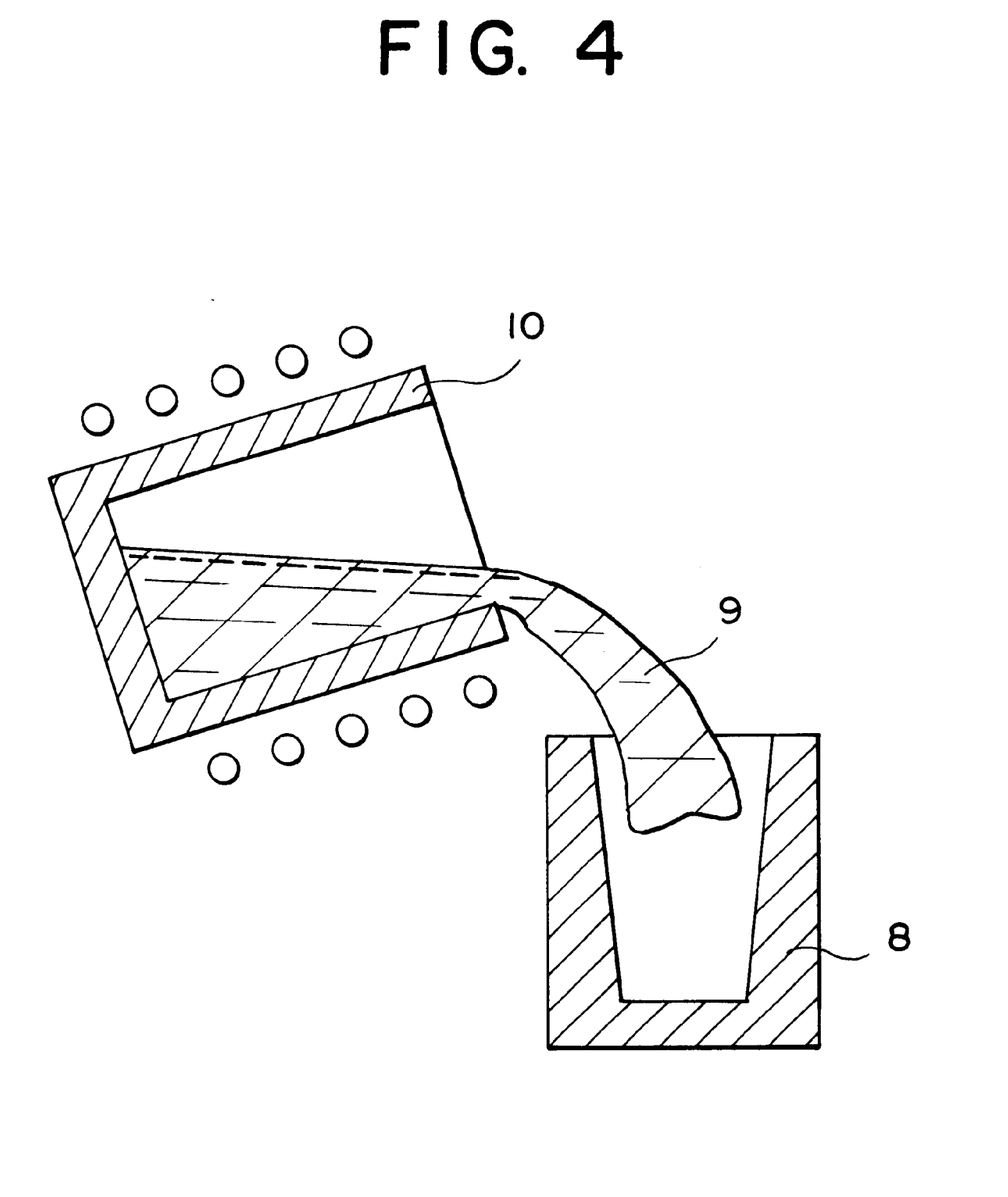
FIG. 4 shows the casting method according to Comparative Example 1.
Figure 5:
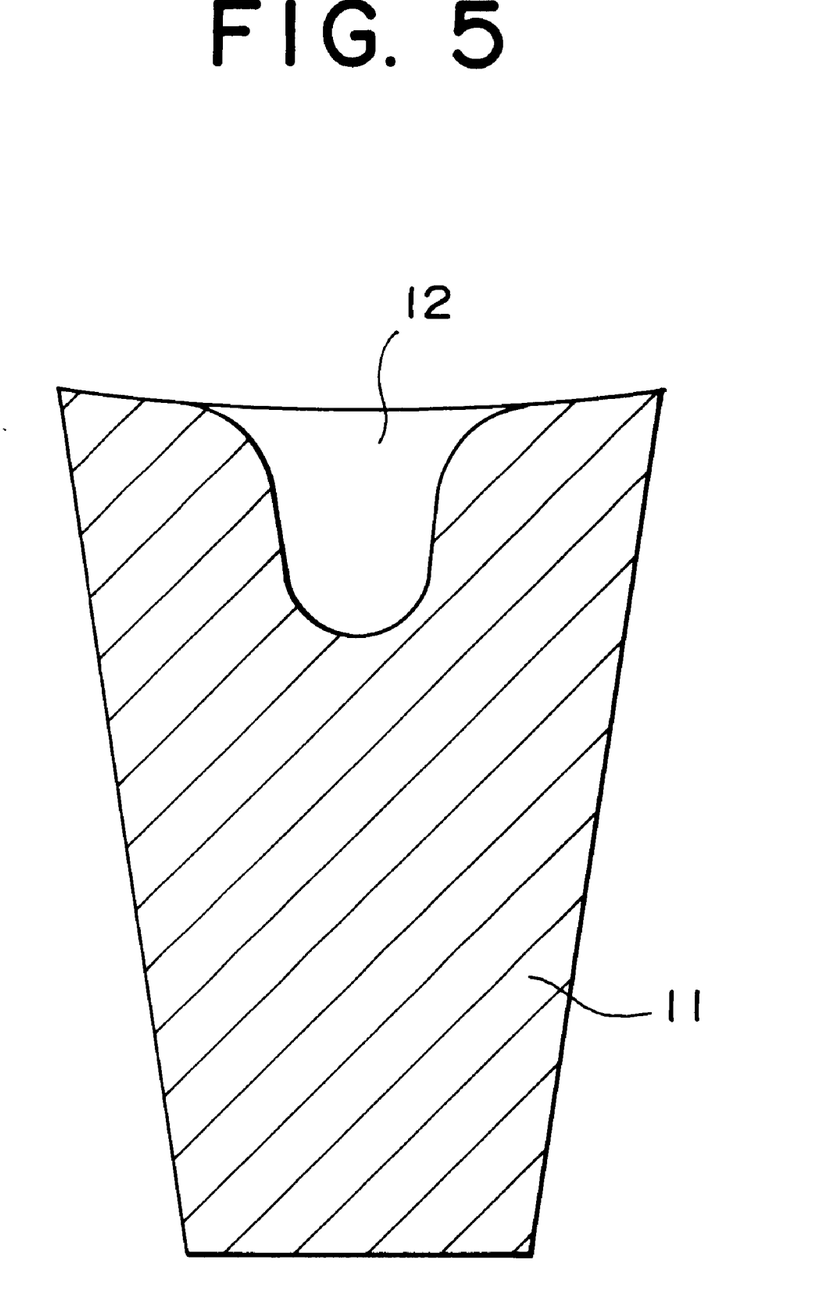
FIG. 5 shows a cross section of the ingot of the Sn based alloy containing the Sn—Ti compound obtained by the casting method according to Comparative Example 1.

Initially, 20 kg of Sn was melted at 1300° C. and, after holding the molten metal at this temperature for about 60 minutes, 0.5 Kg of granular Ti sponge was added into the Sn molten liquid by stirring with a carbon rod (2.5% by weight of Ti relative to the content of Sn). After keeping the temperature for five minutes, slag on the surface of the molten liquid was removed, and the molten liquid was cast at 1200° C. using a stainless steel mold as shown in FIG. 4.

Quality inspection of the Sn based alloy containing the Sn—Ti compound obtained by the method described above showed that the alloy contained 2.3% by weight of Ti as compared with the target Ti content of 2.5% by weight. The particle diameter of the Sn—Ti compound in the Sn based alloy was measured by the same method as in example 1, showing that the ingot of the Sn based alloy containing the Sn—Ti compound contained particles of the Sn—Ti compound having a maximum diameter of 50 μm and mean diameter of 40 μm.

The Sn based alloy containing the Sn—Ti compound was processed into a $Nb_3Sn$ superconducting wire by the same method as in Example 1. The critical current density of this $Nb_3Sn$ superconducting wire was 650 A/mm² as shown in FIG. 1.

Example 2

An ingot of the Sn based alloy was manufactured by the same method as in Example 1, except that the casting temperature was changed to 1300° C. A measurement of the particle size of the Sn—Ti compound in the Sn based alloy showed that the maximum diameter was 30 μm and the mean diameter was 15 μm.

Comparative Example 2

The ingot of the Sn based alloy was manufactured by the same method as in Example 1, except that the casting temperature was changed to 1200° C. A measurement of the particle diameter of the Sn—Ti compound in the Sn based alloy showed that the maximum diameter was 50 μm and the mean diameter was 30 μm.

Comparative Example 3

An ingot of the Sn based alloy was manufactured by the same method as in Example 1, except that the casting temperature was changed to 1550° C. A measurement of the particle diameter of the Sn—Ti compound in the Sn based alloy showed that the maximum diameter was 15 μm and the mean diameter was 10 μm. Although the Sn—Ti compound was finely dispersed in the Sn based alloy, the alloy was burned onto the mold, and the mold was severely damaged.

Example 3

While the molten liquid was directly cast into the copper mold in Example 1, it was cast into the copper mold 1 through the carbon pouring cup 2. The Sn based alloy containing the Sn—Ti compound was melted and cast under the same conditions and by the same method as in Example 1, except that the carbon pouring cup was used.

The quality of the Sn based alloy containing the Sn—Ti compound obtained in this example was inspected and the superconductive characteristics was assessed by the same method as in Example 1, showing that the content of Ti in the Sn based alloy was 2.15% by weight, the maximum particle diameter and mean particle diameter of the Sn—Ti compound were 15 μm and 10 μm, respectively, and all the Sn—Ti compound was composed of $Ti_6Sn_5$. The alloy was processed into a $Nb_3Sn$ superconducting wire by the inner diffusion method as used in Example 1. An assessment of the $Nb_3Sn$ superconducting wire showed a current characteristics of 739 A/mm$^2$ and n-value of 28 which are identical to those obtained in Example 1.

Figure 3:
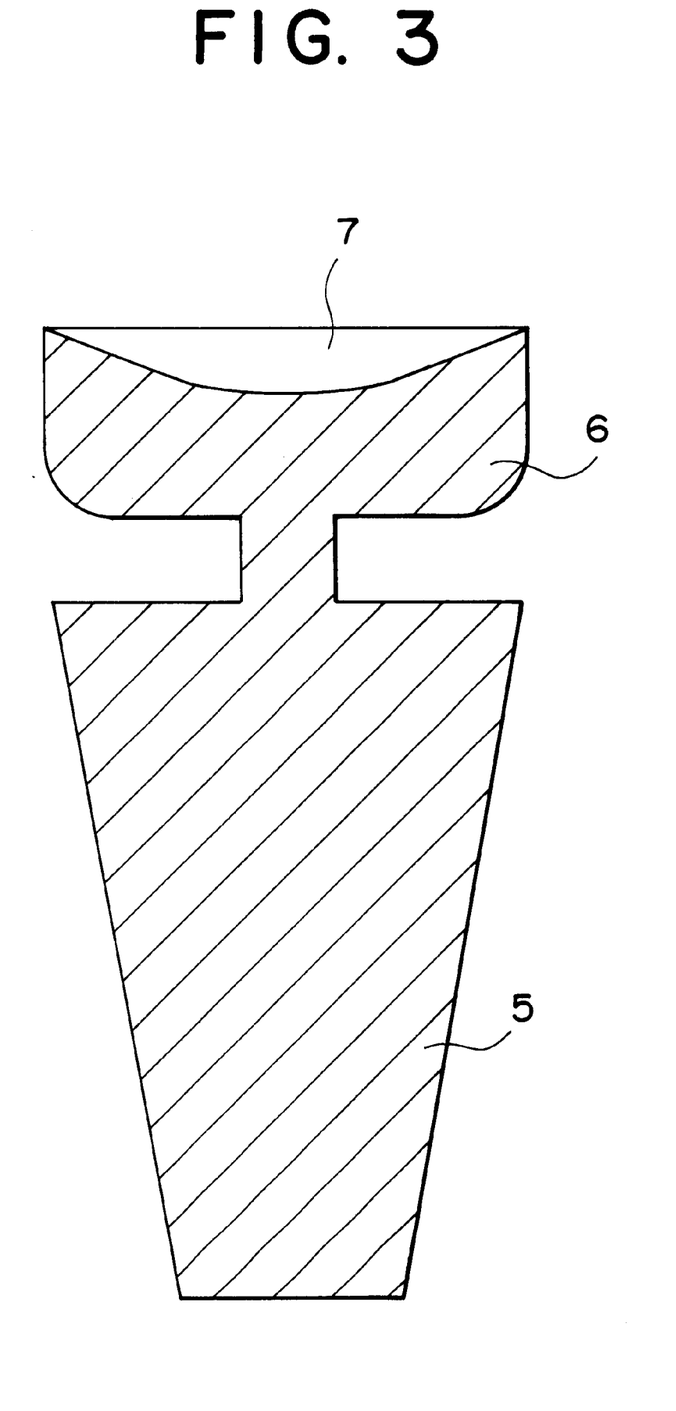
FIG. 3 shows a cross section of the ingot of the Sn based alloy containing the Sn—Ti compound obtained by the casting method through the pouring cup according to Example 3 of the present invention.

The ingot as shown in FIG. 3 was obtained by casting the molten alloy into the mold 1 through the pouring cup 2, resulting in an improvement of the manufacturing yield since the ingot was free from shrinkage cavity as shown in FIG. 3 because the molten liquid in the carbon pouring cup serves as a feed head.

Example 4

While Ti was added into molten Sn at high temperature in Examples 1 to 3, Sn and Ti were placed together in the melting crucible before melting them by heating in this example.

Initially, 50 Kg of Sn and 1 Kg of 7 to 8 mm square Ti pieces with a thickness of 1 mm were placed in the melting crucible (2.0% by weight of Ti relative to the content of Sn was blended). A copper mold with an outer diameter of 220 mm, an inner diameter (1) of 85 mm and an inner diameter (2) of 60 mm, and a height of 510 mm was separately prepared, and a release agent was coated on the inner surface of the mold.

Figure 2:
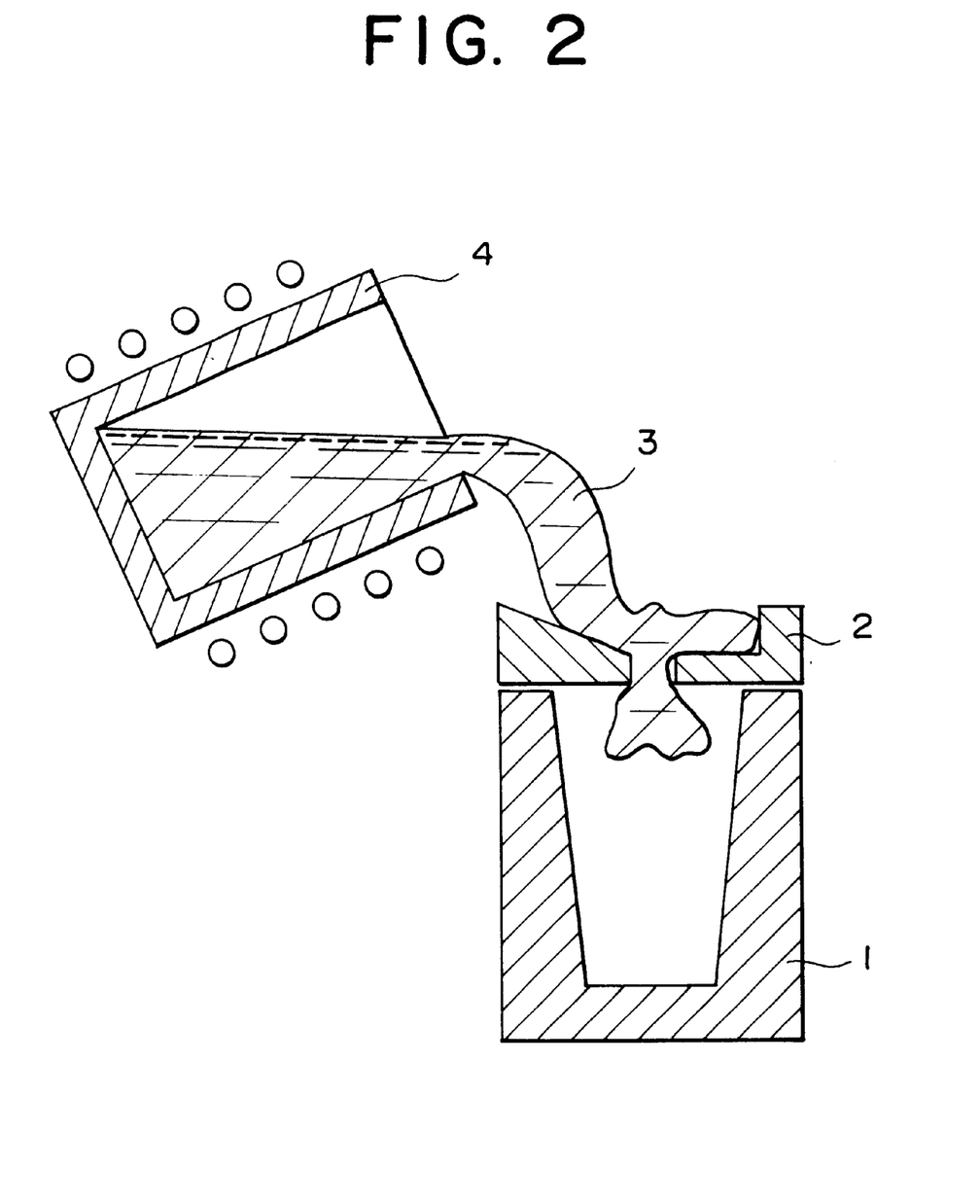
FIG. 2 shows a casting method through a pouring cup according to Example 3 of the present invention.

The insides of the microwave furnace and additive chamber were evacuated to about $10^{-3}$ Torr, and microwave heating was started after confirming that the $O_2$ concentration in the furnace was 1 ppm or less. Ar gas was introduced into the furnace when Sn and Ti were melted by heating at 1300° C., and the temperature was maintained for about 30 minutes. After introducing Ar gas again while heating the molten metals at 1430° C., the molten liquid was cast into a copper mold 1 through a carbon pouring cup 2 as shown in FIG. 2.

The quality of the Sn based alloy containing the Sn—Ti compound obtained in this example was inspected and the superconductive characteristics were assessed by the same method as in Example 1, showing that the content of Ti in the Sn based alloy was 1.95% by weight, the maximum particle diameter and mean particle diameter of the Sn—Ti compound were 15 μm and 10 μm, respectively, and all the Sn—Ti compound was composed of $Ti_6Sn_5$. The alloy was processed thereafter into a $Nb_3Sn$ superconducting wire by the inner diffusion method as used in Example 1. Assessment of the $Nb_3Sn$ superconducting wire showed current characteristics of 742 A/mm$^2$ and n-value of 31 which are identical to those obtained in Example 1.

The ingot as shown in FIG. 3 was obtained by casting the molten alloy into the mold 1 through the pouring cup 2, resulting in an improvement of the manufacturing yield since the ingot was free from shrinkage cavity because the molten liquid in the carbon pouring cup serves as a feed head.

It was a problem that foreign material and slag (oxides of Sn and Ti) on the surface of the molten liquid were distributed throughout the ingot in the conventional method as a result of agitation of the high temperature molten liquid in order to disperse the added Ti. Consequently, the superconducting wire was often broken during the manufacturing process due to the foreign material and slag in the ingot. However, such problems could be prevented from occurring by using the ingot obtained by the method according to Example 4, wherein Sn and Ti were simultaneously placed in the melting crucible before heating.

Needless to say, the quality of the Sn based alloy containing the Sn—Ti compound does not change even when the copper mold is replaced by a water-cooled type copper mold, or when a large scale melting apparatus is used for casting plural ingots.

As hitherto described, the present invention provides a Sn based alloy containing a Sn—Ti compound obtained by the method comprising melting Sn and Ti together in vacuum or in an inert gas atmosphere, and casting into a copper or water-cooled type copper mold having a good cooling ability. Consequently, the Sn—Ti compound is finely dispersed in the Sn based alloy as fine particles with a diameter of 30 μm or less, providing a $Nb_3Sn$ superconducting wire with excellent superconductive characteristics by using the Sn based alloy for manufacturing the superconducting wire.

The Sn based alloy containing the Sn—Ti compound is also provided by the method comprising melting Sn and Ti together in vacuum or in an inert gas atmosphere, and casting in a copper or water-cooled type copper mold having a good cooling ability. Consequently, the Sn—Ti compound is finely dispersed in the Sn based alloy as fine particles with a diameter of 30 μm or less, providing a $Nb_3Sn$ superconducting wire with excellent superconductive characteristics by using the Sn based alloy for manufacturing the superconducting wire.

The Sn based alloy containing the Sn—Ti compound is also provided by the method comprising melting Sn and Ti together in vacuum or in an inert gas atmosphere, and casting in a copper or water-cooled type copper mold having a good cooling ability. Consequently, the Sn—Ti compound is finely dispersed in the Sn based alloy as fine particles with a diameter of 30 μm or less, providing a $Nb_3Sn$ superconducting wire with excellent superconductive characteristics by using the Sn based alloy for manufacturing the superconducting wire.

The present invention provides a Sn based alloy containing a Sn—Ti compound by the method comprising melting Sn and Ti together in vacuum or in an inert gas atmosphere, and casting into a copper or water-cooled type copper mold having a good cooling ability. Consequently, the Sn—Ti compound is finely dispersed in the Sn based alloy as fine particles with a diameter of 30 μm or less, providing a $Nb_3Sn$ superconducting wire with excellent superconductive characteristics by using the Sn based alloy for manufacturing the superconducting wire.

The present invention provides a Sn based alloy containing a Sn—Ti compound by the method comprising melting Sn and Ti together in vacuum or in an inert gas atmosphere, and casting into a copper or water-cooled type copper mold having a good cooling ability through a carbon pouring cup. Consequently, the Sn—Ti compound is finely dispersed in the Sn based alloy as fine particles with a diameter of 30 μm or less, providing a $Nb_3Sn$ superconducting wire with excellent superconductive characteristics by using the Sn based alloy for manufacturing the superconducting wire. In addition, the ingot obtained is free from shrinkage cavitys since the molten liquid in the carbon pouring cup serves as a feed head, providing the effect of improving the manufacturing yield of the ingot.

The Sn based alloy containing a Sn—Ti compound is also provided by the method comprising melting Sn and Ti together in vacuum or in an inert gas atmosphere, and casting into a copper or water-cooled type copper mold having a good cooling ability. Consequently, the Sn—Ti compound is finely dispersed in the Sn based alloy as fine particles with a diameter of 30 μm or less, providing a $Nb_3Sn$ superconducting wire with excellent superconductive characteristics by using the Sn based alloy for manufacturing the superconducting wire.

The Sn based alloy containing a Sn—Ti compound is also provided by the method comprising melting Sn and Ti together in vacuum or in an inert gas atmosphere, and casting into a copper or water-cooled type copper mold having a good cooling ability. Consequently, the Sn—Ti compound is finely dispersed in the Sn based alloy as fine particles with a diameter of 30 µm or less, providing a $Nb_3Sn$ superconducting wire with excellent superconductive characteristics by using the Sn based alloy for manufacturing the superconducting wire.

The present invention provides a precursor of the Nb3Sn superconducting wire prepared by an inner diffusion method useful for manufacturing the superconducting wire.

The precursor of the Nb3Sn superconducting wire useful for manufacturing the superconducting wire may be also prepared by the inner diffusion method.

What is claimed is:

1. An Sn-based alloy containing a Sn—Ti compound prepared by adding 0.1 to 5% by weight of Ti, relative to the content of Sn, wherein particles of the Sn—Ti compound have a maximum diameter not exceeding 30 µm and a mean diameter within a range of 5 to 20 µm.

2. The Sn-based alloy according to claim 1, wherein the Sn—Ti compound is an alloy mainly comprising $Ti_6Sn_5$.

3. The Sn-based alloy according to claim 1, wherein the particles of the Sn—Ti compound have a maximum diameter of 15 µm and a mean diameter of within a range of 5 to 10 µm.

4. A precursor of a $Nb_3Sn$ superconducting wire having a structure in which at least one rod of Nb and at least one rod of the Sn-based alloy containing the finely dispersed Sn—Ti compound according to claim 1 are integrated into a copper-based metal alloy so that the rods do not make direct contact with each other.

5. The precursor of a $Nb_3Sn$ superconducting wire according to claim 4 including a rod of the Sn-based alloy according to claim 1 integrated at the center of a rod-shaped Cu-based metal including a plurality of the Nb rods.

* * * * *